United States Patent

Sieber

[15] 3,657,576

[45] Apr. 18, 1972

[54] CONTACTLESS SWITCH USING MAGNETIC DIODES

[72] Inventor: Paul Sieber, Heilbronn-Bockingen, Germany

[73] Assignee: Licentia Patent-Verwaltungs-G.m.b.H., Frankfurt am Main, Germany

[22] Filed: Aug. 25, 1970

[21] Appl. No.: 66,781

[30] Foreign Application Priority Data

Sept. 3, 1969 Germany ......................P 19 44 690.3

[52] U.S. Cl. ...............................307/309, 307/253, 307/256
[51] Int. Cl. .......................................................H03k 17/00
[58] Field of Search ....................307/309, 299 A; 317/235 Z

[56] References Cited

UNITED STATES PATENTS

| | | | |
|---|---|---|---|
| 3,535,626 | 10/1970 | Uemura et al. | 307/309 X |
| 3,323,071 | 5/1967 | Mitchell | 307/235 Z |

*Primary Examiner*—Donald D. Forrer
*Assistant Examiner*—B. P. Davis
*Attorney*—Spencer & Kaye

[57] ABSTRACT

A contactless switch comprises a controllable active switching element connected through a threshold responsive circuit element to a voltage divide including two series connected magnetic field dioxides which, on variation of a magnetic field vary the voltage division of the voltage divide.

8 Claims, 3 Drawing Figures

PATENTED APR 18 1972 3,657,576

Inventor:
Paul Sieber
BY Spencer & Kaye
ATTORNEYS.

CONTACTLESS SWITCH USING MAGNETIC DIODES

BACKGROUND OF THE INVENTION

The present invention relates to a contactless switch having a controllable active switching element, wherein the particular switching state is determined by a magnetic field acting on the circuit from the outside.

SUMMARY OF THE INVENTION

According to the invention, there is provided a contactless switch comprising a controllable active switching element, a control region or electrode in said active switching element, a voltage divider including first and second magnetic field diodes connected in series and adapted to reacted upon by a variable magnetic field for varying the voltage division, means for connecting said control region or electrode to said voltage divider, and a threshold responsive circuit element connected between said voltage divider and said control region or electrode.

BRIEF DESCRIPTION OF THE DRAWINGS

The invention will now be described in greater detail by way of example with reference to the accompanying drawings, in which.

DESCRIPTION OF THE PREFERRED EMBODIMENT

Figure 1:
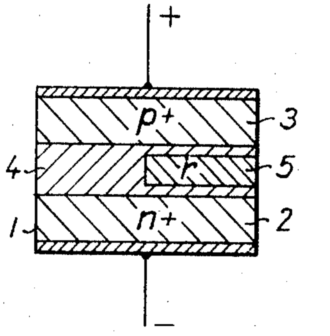
FIG. 1 is a diagrammatic representation of a magnetic field divide.

A magnetic-field or magnetic diode varies its ohmic resistance when it is operated in the forward direction, depending on the magnetic flux permeating the diode. Such a magnetic-field diode is illustrated in FIG. 1. It consists of a semiconductor body 1, for example of monocrystalline silicon or germanium. Heavily doped semiconductor regions 2 and 3 of the opposite type of conductivity are provided at opposite surfaces of the semiconductor body. Between the region 3 with P-type doping and the region 2 with N-type doping, there is a high-resistance n-type, P-type or intrinsic conducting region 4, in which the life of the charge carriers is very great. At the lateral edge of the semiconductor body, a region 5 is provided at one side in which the recombination probability for the penetrating charge carriers is extremely great. Now if the forward current of the diode flowing between the region 2 with N-type doping and the region 3 with P-type doping is forced into the recombination region 5 by a magnetic field acting thereon, many of the injected charge carriers recombine and the ohmic resistance of the magnetic diode rises. On the other hand, if the forward current is deflected further and further away from the recombination region 5 by a magnetic field of the opposite polarity, the possibility of recombination for the injected charge carriers drops and hence also the ohmic resistance of the whole arrangement.

Figure 2:
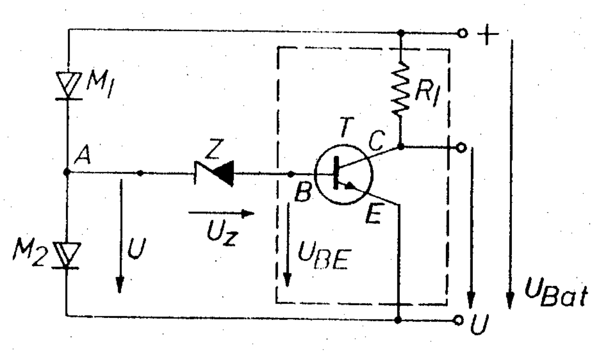
FIG. 2 is a circuit diagram of a contactless switch in accordance with the invention.
Figure 3:
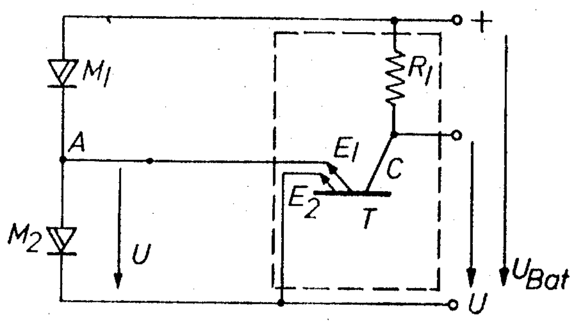
FIG. 3 is a circuit diagram similar to FIG. 2 but showing a circuit more suitable for construction by integrated circuit techniques.

If, as is the case in the circuit according to the invention, two magnetic-field diodes are connected in series, both diodes being poled in the forward direction, and the centre electrode of the voltage divider thus formed is connected to the controllable switching element, then the temperature-dependence of the two diodes is compensated. On the other hand, the magnetic sensitivity of the two diodes is added if the recombination regions of the two diodes are so disposed that, under the action of a field, the ohmic resistance of the one diode is increased and the ohmic resistance of the other diode reduced. In FIGS. 2 and 3, a parallel line in the diodes illustrated symbolically indicates the side of the semiconductor body at which there is provided the region having the higher recombination probability.

In the circuit arrangement according to the invention the active switching element preferably consists of a transistor. Thyristors, unijunction transistors or other active switching elements may, however, be used.

The magnetic field necessary for actuating the switch is preferably produced from a displacable and/or rotatable permanent magnet or electromagnet.

FIG. 2 shows the circuit of a contactless switch in conventional circuitry, while in FIG. 3 a circuit is illustrated which is suitable for integration and in which a multi-emitter transistor may be used to advantage. In the circuit as shown in FIG. 2, the active switching element consists of a bipolar transistor of the NPN-type of conductivity. The base electrode B of the transistor T is connected to the one electrode of a zenor diode Z operated in the reverse direction, the other electrode being connected to the center electrode A of the voltage divider consisting of two magnetic-field diodes $M_1$ and $M_2$. The two magnetic-field diodes are connected between the poles of a source of supply voltage so that both diodes are operated in the forward direction. The collector electrode C of the transistor T is connected, through a resistor $R_1$, to the one pole, in this case to the positive pole, of the source supply voltage, while the emitter electrode E is connected to the other pole, in the present NPN-transistor, to the earth electrode, of the source of supply voltage.

Assuming like magnetic diodes $M_1$ and $M_2$, then when no external magnetic field is present, half the operating voltage appears at the centre electrode A of the voltage divider. If an external field now acts on the two magnetic-field diodes with such a polarity that the forward resistance of the diode $M_1$ is lower and that of the diode $M_2$ is higher, the potential rises at the electrode A. If this potential reaches a value which exceeds the sum of the zener voltage $U_z$ of the zener diode Z and the base-to-emitter voltage $U_{BE}$ of the transistor T, a base current can flow which many then cause a collector current which is higher by the current amplification factor B. The collector resistor $R_1$ is preferably such that when the transistor T is connected through, the output voltage $U_{aus}$ corresponds to the emitter-collector saturation voltage of the transistor T.

If, on the other hand, a magnetic field, the polarity of which is opposite to the polarity of the magnetic field described above, acts on the magnetic-field diodes $M_1$ and $M_2$, the forward resistance of the diode $M_1$ becomes greater and that of $M_2$ becomes less. Thus the potential at the centre electrode A drops below half the operating voltage. If the circuit is so designed for the case that the sum of the zener voltage $U_z$ of the zener diode Z and of the base-emitter voltage $U_{BE}$ of the transistor T is greater than the no-load voltage $U_{ein}$ at the input of the circuit, then the transistor T remains reliably cut off under the field conditions outlined. Thus the operating voltage $U_{Bat}$ appears between the collector electrode C and the earth electrode, at the output of the transistor. By appropriate selection of the magnetic field strength associated with the particular switching state, or by setting the threshold voltage $U_s = U_z + U_{BE}$, the effect is achieved that the transistor T is either completely cut off or conducts very well. A defined magnetic field $H_1$ or $H_2$ is therefore preferably associated with each of the two switching states of the transistor T. This may be effected, for example, by the fact that two permanent magnets of opposite polarity are secured to a slide. The series connection of the two magnetic diodes is secured in the immediate vicinity of the slide, for example to an iron return member for the magnetic field. By actuating the slide, the one permanent magnet or the other, depending on the required switching state, is brought into the vicinity of the magnetic-field diodes so that only the field originating from this permanent magnet acts on the diodes. The slide may be brought into the particular position by means of a conventional push button for example.

In FIG. 3, the circuit shown in FIG. 2 is modified so that, with the exception of the two magnetic-field diodes, all circuit elements can be accommodated in a common semiconductor body, in an integrated form of construction. The transistor T is a mult-emitter transistor, for example with two emitter regions let into the base region. The one emitter-to-base space is utilised as a zener diode so that the emitter electrode $E_1$ of this emitter-base space can be connected directly to the center electrode A of the voltage divider consisting of two magnetic-field diodes $M_1$ and $M_2$. The second emitter electrode $E_2$, on the other hand, like the emitter in the circuit shown in FIG. 2, is connected to the earth electrode. The collector is connected, through a resistor R1, to the positive pole of the source supply voltage, assuming that the polarity of the transistor is of the NPN-type, as also in the circuit shown in FIG. 2.

It is obvious that by reversing the polarity of the source of supply voltage, PNP-transistors can also be used for the contactless switch according to the invention. The magnetic-field diodes may also be constructed in the most varied ways. The only important this is that diodes should be available, the ohmic resistance of which in the forward direction has a substantial dependence on the magnetic field strength acting on the diode.

It will be understood that the above description of the present invention is susceptible to various modifications changes and adaptations.

What is claimed is:

1. In a contactless switch comprising a controllable active switching element, a control region or electrode in said active switching element, a voltage divider including first and second magnetic field diodes connected in series, and adapted to be acted upon by a variable magnetic field for varying the voltage division, means for connecting said control region or electrode to said voltage divider, and a threshold responsive circuit element connected between said voltage divider and said control region or electrode, the improvement wherein: said controllable active switching element is a transistor having two emitter regions and said threshold responsive circuit element comprises a zener diode formed by the emitter to base path via one of said emitter regions of said transistor, said one emitter region being directly connected to the junction of said magnetic field diodes.

2. A switch as defined in claim 1, further comprising a source of supply voltage across which said series connection of said magnetic field diodes are connected in the forward direction.

3. A switch as defined in claim 1, further comprising a source of supply voltage, the other of said two emitter regions of said transistor being connected to one pole of said source of supply voltage, and the collector of said transistor being connected to the other pole of said source of supply voltage via a resistor for providing that the collector emitter saturation voltage of said transistor appears between said collector and said emitter when said transistor is conducting.

4. A switch as defined in claim 3, further comprising an integrated solid state circuit including said transistor and said resistor.

5. A switch as defined in claim 1, further comprising a displacable permanent magnet for producing said variable magnetic field.

6. A switch as defined in claim 1, further comprising a displacable electro magnet for producing said variable magnetic field.

7. A switch as defined in claim 1, further comprising a rotatable permanent magnet for producing said variable magnetic field.

8. A switch as defined in claim 1, further comprising a rotatable electromagnet for producing said variable magnetic field.

* * * * *